United States Patent
Larsen et al.

(10) Patent No.: US 6,598,270 B2
(45) Date of Patent: Jul. 29, 2003

(54) EQUIPMENT MOUNTING STRAP

(75) Inventors: Lars R. Larsen, Old Lyme, CT (US); Stewart A. Levesque, Scotland, CT (US); Lylette Schumacher, Niantic, CT (US)

(73) Assignee: Ortronics, Inc., New London, CT (US)

( * ) Notice: Subject to any disclaimer, the term of this patent is extended or adjusted under 35 U.S.C. 154(b) by 7 days.

(21) Appl. No.: 09/772,411

(22) Filed: Jan. 30, 2001

(65) Prior Publication Data

US 2002/0100147 A1 Aug. 1, 2002

(51) Int. Cl.⁷ .................. B65D 63/00; A44B 21/00; A47C 7/00
(52) U.S. Cl. ............ 24/298; 24/16 R; 24/68 CD; 248/68.1; 410/110
(58) Field of Search .................. 24/298, 17 R, 24/16 R, 68 CD, 909; 248/68.1, 49, 683, 918; 211/26; 410/105, 110

(56) References Cited

U.S. PATENT DOCUMENTS

| | | | | |
|---|---|---|---|---|
| 749,834 A | * | 1/1904 | Beisel | 248/68.1 |
| 857,050 A | * | 6/1907 | Gottschalk | 211/26 |
| 1,177,124 A | * | 3/1916 | Michael | 248/68.1 |
| 3,142,495 A | * | 7/1964 | Lu | 281/29 |
| 3,226,069 A | * | 12/1965 | Clarke | 248/49 |
| 3,947,927 A | * | 4/1976 | Rosenthal | 24/16 R |
| 4,484,847 A | * | 11/1984 | Holmes | 410/104 |
| 4,850,770 A | * | 7/1989 | Millar, Jr. | 410/110 |
| 4,866,215 A | | 9/1989 | Muller et al. | |
| 5,073,841 A | | 12/1991 | DelGuidice et al. | |
| 5,100,007 A | | 3/1992 | Espasandin et al. | |
| 5,111,554 A | * | 5/1992 | Sweers | 24/16 R |
| 5,175,673 A | | 12/1992 | Roger et al. | |
| 5,201,100 A | * | 4/1993 | Cardinale | 24/306 |
| 5,316,243 A | | 5/1994 | Henneberger | |
| 5,352,854 A | | 10/1994 | Comerci et al. | |
| 5,372,262 A | | 12/1994 | Benson et al. | |
| 5,624,360 A | * | 4/1997 | Wilkins | 482/129 |
| 5,640,482 A | | 6/1997 | Barry et al. | |
| 5,788,087 A | | 8/1998 | Orlando | |
| 5,809,620 A | * | 9/1998 | Crowley et al. | 24/68 CD |
| 5,836,551 A | | 11/1998 | Orlando | |
| 5,839,702 A | | 11/1998 | Jette | |
| 5,893,539 A | | 4/1999 | Tran et al. | |
| 6,019,323 A | | 2/2000 | Jette | |
| 6,067,233 A | | 5/2000 | English et al. | |
| 6,102,214 A | | 8/2000 | Mendoza | |

FOREIGN PATENT DOCUMENTS

| | | | | |
|---|---|---|---|---|
| DE | 2440901 | | 3/1976 | |
| FR | 2620751 | | 3/1989 | |
| GB | 1297146 | * | 11/1972 | 24/68 CD |
| GB | 2271403 | * | 4/1994 | 24/68 CD |
| SE | 0176331 | * | 8/1961 | 24/198 |

OTHER PUBLICATIONS

Copy of International Search Report dated Oct. 24, 2002.
Chatsworth Products, Inc. Catalog, Tower CPU Adjustable Tie–Down Brackets, p. 170; no date is given.

* cited by examiner

*Primary Examiner*—Victor Sakran
(74) *Attorney, Agent, or Firm*—Cummings & Lockwood

(57) ABSTRACT

An equipment mounting strap is disclosed for securing equipment in a rack having side frames. The equipment mounting strap includes two angled brackets, each bracket including a first leg defining a slot for receiving a strap and a second leg having means for fastening the angled bracket to one of the side frames of the rack, a bumper mounted on each angled bracket adjacent the slot, and a composite strap having one end fixedly fastened through the slot of one of the angled brackets and the other end detachably fastened through the slot of the other of the angled brackets.

36 Claims, 5 Drawing Sheets

EQUIPMENT MOUNTING STRAP

BACKGROUND OF THE INVENTION

1. Field of the Invention

The present disclosure relates generally to an equipment mounting strap, and, more particularly, to an adjustable equipment mounting strap for securing equipment in a predetermined position in an equipment rack.

2. Background of the Invention

Computer processing units ("CPU") are often mounted in electronics racks to organize and consolidate computer system installations. An example of an electronics rack wherein a CPU may be installed is the Mighty Mo 3™ cable management rack (p/n OR-60400169) wherein an equipment shelf (p/n OR-60400355) is installed. Both the rack and shelf are sold by Ortronics, Inc. (New London, Conn.) In such installations, a CPU is typically secured in position with a set of sheet metal brackets that rigidly attach the CPU to the rack.

There are a number of disadvantages associated with using rigid brackets to secure CPUs in position in an electronics rack. For example, it is cumbersome and time consuming for a technician to install a CPU using rigid brackets. In addition, it is cumbersome and time consuming for a technician to adjust rigid brackets when a CPU must be replaced, especially if the replacement CPU has significantly different dimensions than the original. Furthermore, rigid brackets can mar the housing of a CPU, or the connectors assembled thereto, if the brackets are installed incorrectly. Further still, rigid brackets can interfere with the installation of a second CPU that is to be positioned along side the first CPU on the equipment shelf of the electronics rack.

In view of the above-described disadvantages associated with rigid brackets, there is clearly a need in the art for an improved device that can be used for securing a CPU or other related equipment in position in an electronics rack. The device must eliminate the above-described disadvantages and be relatively economical to purchase. Such a device is disclosed herein and illustrated in the figures appended hereto.

SUMMARY OF THE INVENTION

The present invention is directed toward an equipment mounting strap for use in securing equipment in a rack having side frames. An embodiment of the equipment mounting strap includes two angled brackets, each bracket including a first leg having a slot for receiving a strap and a second leg configured for fastening the angled bracket to one of the side frames of the rack. A bumper is attached to each angled bracket adjacent the slot to space the equipment from the angled brackets, and thereby prevent the equipment from shifting and being marred. The equipment mounting strap further includes a composite strap that has one end attached to one of the angled brackets and the other end attached to the other of the angled brackets. The composite strap includes an elastic strap section and a strap-type fastener section extending from each end of the elastic strap section. At least one of the strap-type fastener sections is detachable.

The at least one detachable strap-type fastener section can be a hook and loop type fastener made with components from a fastening system such as a standard Velco® brand hook and loop type fastener system and an Omni-Tape® brand hook and loop type fastening system. The bumpers can be adhesive-backed or include a threaded stud for attaching them to their respective angled brackets. To attach the angled brackets to the side frames of the equipment rack, each of the second legs of the angled brackets may include elongated mounting holes through which threaded fasteners are passed. The composite strap may be dimensioned to wrap around and secure a CPU or other related equipment in a predetermined position on a shelf in the equipment rack.

These and other embodiments of the present invention are described and claimed herein and illustrated in the appended figures. It is notable that although the description of the preferred embodiments and the figures herein below frequently refer to an equipment mounting strap for mounting a CPU in an electronics rack, those of ordinary skill in the art will appreciate that the present invention may be used to mount other types of equipment in other types of racks.

BRIEF DESCRIPTION OF THE DRAWINGS

So that those of ordinary skill in the art to which the subject invention pertains will more readily understand how to make and use the device described herein, preferred embodiments of the invention will be described in detail with reference to the figures, wherein.

DETAILED DESCRIPTION OF THE PREFERRED EMBODIMENTS

Figure 1:
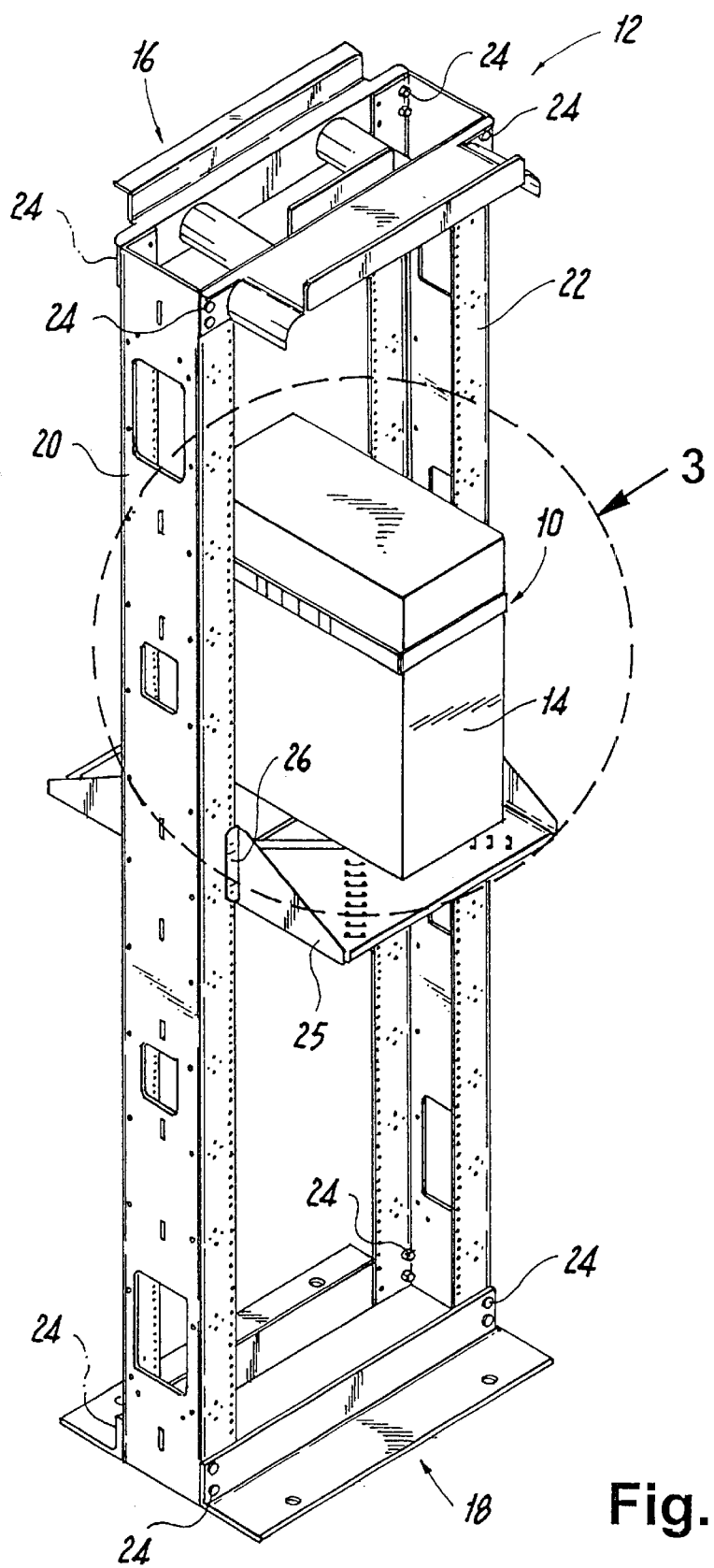
FIG. 1 is a perspective view of an electronics rack including an equipment shelf on which a CPU is strapped in position with an embodiment of the disclosed invention.
Figure 2:
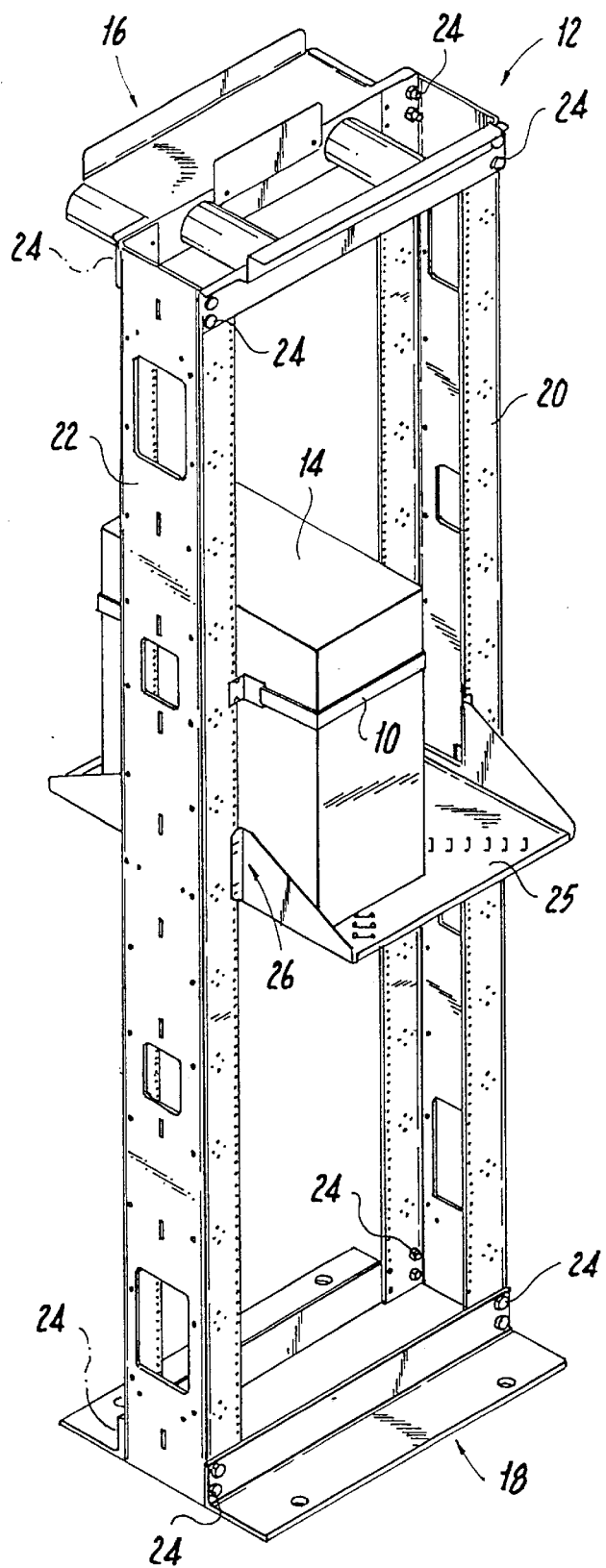
FIG. 2 is a perspective view similar to FIG. 1, however, viewed from the opposite side of the electronics rack.

Reference is now made to the above-described figures wherein like reference numerals identify similar structural elements of the subject invention. Referring to FIGS. 1 and 2 there is illustrated an electronics rack 12 in which an embodiment of the present invention 10 is used for securing a computer processing unit ("CPU") 14 in place.

More particularly, the electronics rack 12 includes an upper structure 16, a base structure 18, a left-hand ("LH") side frame 20, and a right-hand ("RH") side frame 22. The LH and RH side frames 20, 22 include standard EIA hole patterns, a standard that is well known to those having ordinary skill in the art. The four components 16, 18, 20, 22 of the electronics rack 12 are fastened to each other by nuts and bolts 24. An equipment shelf 25 is fastened to the LH side frame 20 and the RH side frame 22 with threaded fasteners 26. The height of the equipment shelf 25 is adjustable. An embodiment of the present invention 10, which is described herein as an "equipment mounting strap," is mounted to the RH side frame 22 above the equipment shelf 25 a distance equal to approximately two-thirds the height of the CPU 14.

Figure 3:
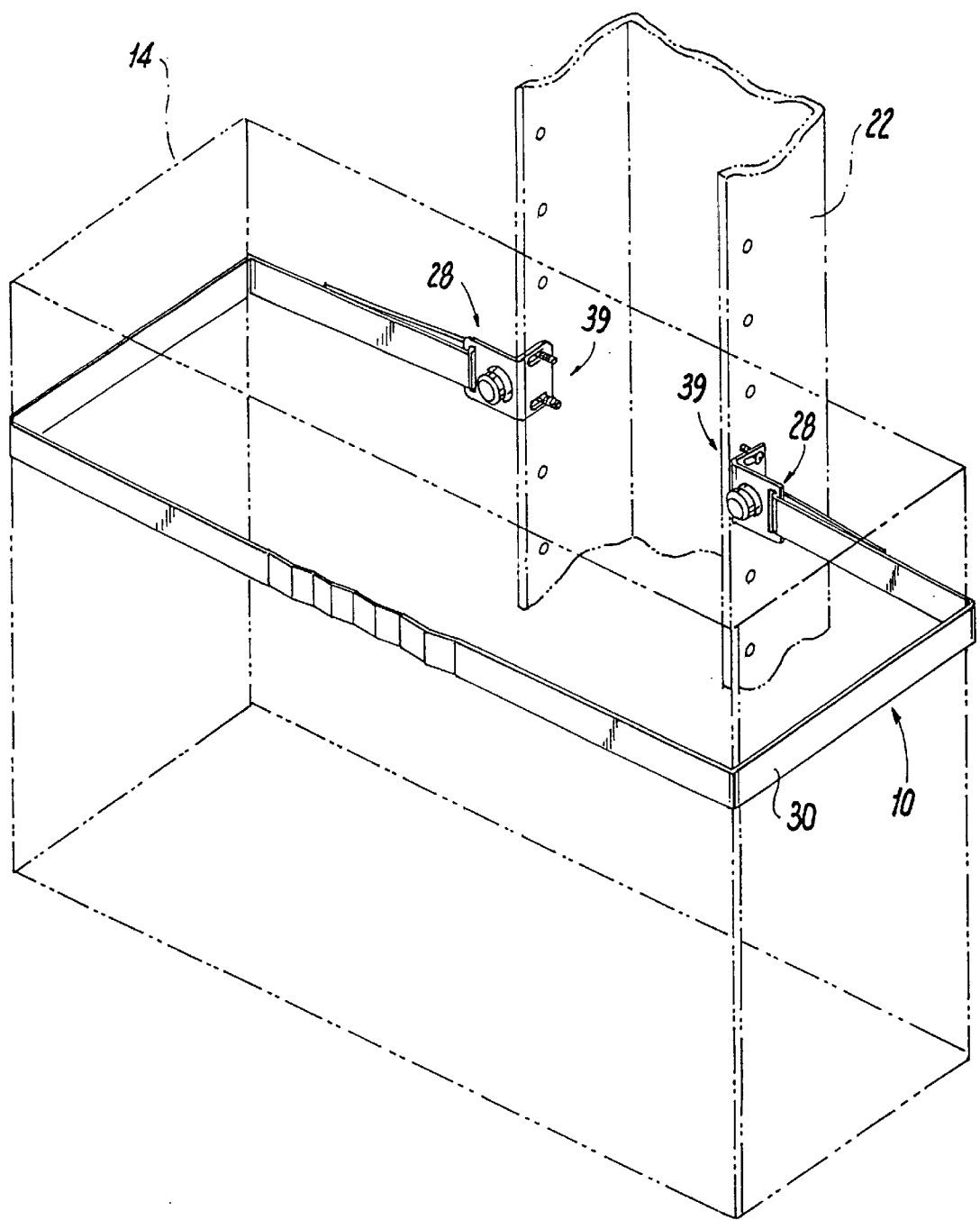
FIG. 3 is a more detailed perspective view, taken from FIG. 1, of a portion of the electronics rack, CPU, and embodiment of the disclosed invention.

Referring to FIG. 3, the equipment mounting strap 10 shown in FIGS. 1 and 2 is shown in more detail to illustrate how the CPU 14 is secured to the RH side frame 22. Both the CPU 14 and the RH side frame 22 are shown in phantom lines to facilitate clarity. The equipment mounting strap 10 includes two mounting brackets 28 and a composite strap 30 and is conveniently attached to the EIA compliant RH side frame 22 with four threaded fasteners 39. Those of ordinary skill in the art will appreciate that the EIA standard includes fasteners having 10–32, 12 –24, M5 and M6 threads. Each component 28, 30 of the equipment mounting strap 10 is described in more detail herein below.

Figure 4A:
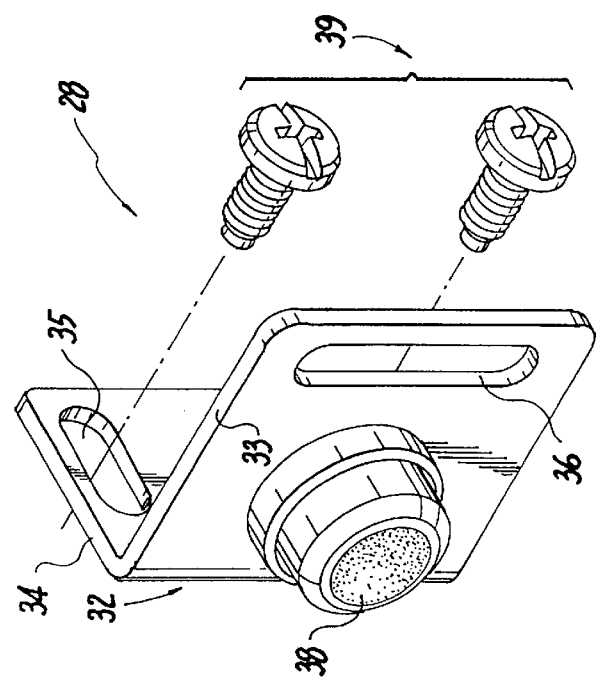
FIG. 4A is a perspective view of a mounting bracket used in an embodiment of the disclosed invention.

Referring to FIG. 4A, each mounting bracket 28 includes an angled bracket 32 having a first leg 33 and a second leg 34. A strap slot 36 is machined or punched into the first leg 33 and two elongated mounting holes 35 are machined or punched into the second leg 34. An adhesive-backed bumper 38 is adhered to the outside surface of the first leg 33, adjacent the strap slot 36. The bumper 38 can have any one of a variety of shapes including, for example, circular recessed (as shown), cylindrical, square, and hemispherical. In addition, the bumper 38 can be made from any one of a variety of materials including, for example, rubber, PVC, polyurethane, and delrin. Furthermore, the bumper 38 can be attached to the outside surface of the first leg 33 in any number of ways including, for example, adhesives, screws, and rivets.

As noted above, each mounting bracket 28 is conveniently attached to the EIA compliant RH side frame 22 with two threaded fasteners 39. With some minor modifications to the side frame or the second leg 34 of the angled bracket 38, the mounting brackets 28 may be mounted using other types or sizes of fasteners including, for example, rivets, quarter-turn fasteners, captivated spring-loaded fasteners, etc.

Figure 4B:
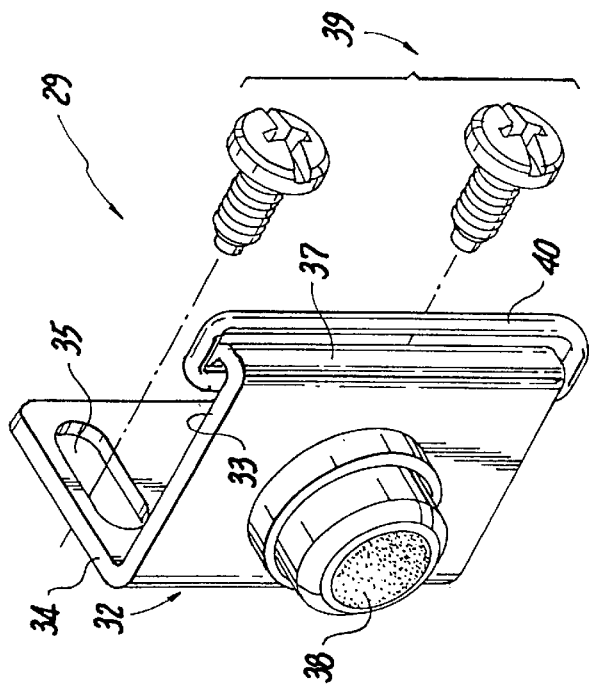
FIG. 4B is a perspective view of another mounting bracket used in an embodiment of the disclosed invention.

Referring to FIG. 4B, an example of another mounting bracket 29 that may be used in an embodiment of the present invention is illustrated. Similar to mounting bracket 28, mounting bracket 29 includes an angled bracket 32 having a first leg 33 and a second leg 34. However, instead of including a strap slot 36, the first leg 33 includes a reverse bend 37 that forms a tube in which a strap ring 40 is received. A slot is formed between the reverse bend 37 and the strap ring 40. The mounting bracket 29 also includes an adhesive-backed bumper 38 adhered to the outside surface of the first leg 33 adjacent the strap ring 40.

Figure 5:
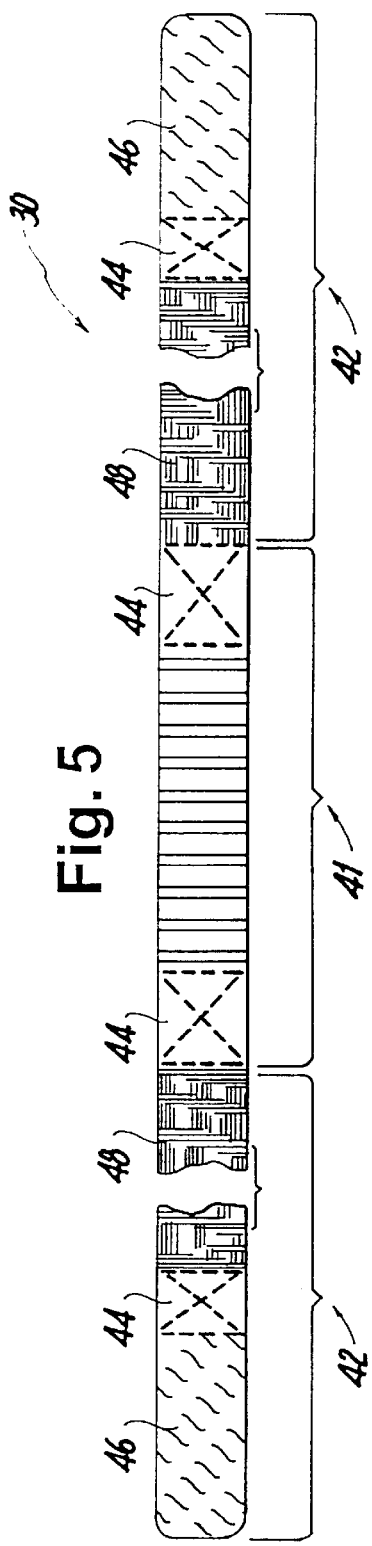
FIG. 5 is a side view of a compound strap used in an embodiment of the disclosed invention.

Referring to FIG. 5, the composite strap 30 includes three sections, namely, an elastic section 41 and two strap-type fastener sections 42 extending from each end of the elastic section. Each section 41, 42 is sewn to the other with a stitch pattern 44. Various other methods may be employed to attach the sections including, for example, riveting, adhering, ultrasonic welding, and dielectric heat sealing.

The elastic section 41 may be made from Velstretch® brand elastic strapping material, which is sold by Velcro USA Inc. (Manchester, N.H.) The strap-type fastener sections 42 may be constructed using, for example, a hooked section 46 and a looped section 48 to form a hook and loop fastening system as shown. Various hook and loop fastener systems are available including the standard Velcro® brand hook and loop type fastening system or the Omni-Tape® brand hook and loop type fastening system. Both systems are sold by Velcro USA Inc. A hook and loop fastening system such as that described above may also be referred to as a detachable strap-type fastener.

The dimensions for a composite strap 30 that may be used for the sections in an embodiment of the present invention are as follows: the stretch section 41 is made six inches (152.4 mm) long; the loop section 48, a section of which is sewn to each end of the stretch section 41, is made 25.5 inches (647.7 mm) long; and the hook section 46, a section of which is sewn to each end of the loop section 48, is made three inches (76.2 mm) long. The overall length of the composite strap 30 is 63 inches (1600 mm) long. Each section preferably includes sufficient additional material for overlapping the sections so that they may be properly sewn in a fashion that is well known by those of ordinary skill in the art. The width of each section is one inch (25.4 mm). Of course, the dimensions chosen for a particular composite strap 30 depends on the particular application for which the equipment mounting strap 10 is being used.

Another example of a composite strap 30 that may be used in an embodiment of the present invention includes a detachable strap-type fastener section attached to one end of the elastic section 41 and a non-detachable fastener section attached to the other end of the elastic section. The non-detachable strap-type fastener section is looped through the strap slot 36 of the mounting bracket 28 and is attached to itself, for example, by stitching. The non-detachable strap-type fastener section may be made from, for example, a length of nylon. The detachable strap-type fastener section may be a hook and loop type fastener as described above.

In use, after the equipment mounting strap 10 is installed on the side frame 22 of the equipment rack 12, the CPU 14 is secured as follows. With at least one end of the composite strap 30 unfastened, the CPU 14 is slid onto the equipment shelf 25 and placed into position against the bumpers 38 mounted on the mounting brackets 28. Once the CPU 14 is in position, the composite strap 30 is wrapped around the CPU and the free end of the composite strap is passed through the slot 36 in its corresponding mounting bracket 28. The composite strap 30 is then made snug around the CPU by pulling on the end of the unfastened detachable strap-type fastener section sufficiently to at least partially stretch the elastic section 41. It is preferable that the elastic section 41 is stretched to about one-half its full-stretch rating. Thereafter, the unfastened end of the detachable strap-type fastener section is fastened.

Those of ordinary skill in the art will appreciate that there are several advantages associated with the equipment mounting strap 10. For example, the equipment mounting strap 10 readily accommodates various sized and various styled equipment. In addition, the equipment mounting strap 10 makes it easy to remove and replace faulty equipment. Furthermore, the elastic section 41 makes it easy to adjust the composite strap 30 around equipment so that it snugly holds the equipment in position. Still further, the bumpers 38 ensure a space between the first leg 33 of each angled bracket 32 and the equipment so that the end of the fastener section 42 of the composite strap 30 is not pinched there between, thereby making it easier to adjusted and fasten the composite strap 30. Even further, the bumpers 38 may be made from a non-abrasive material to prevent marring of the equipment.

Figure 6:
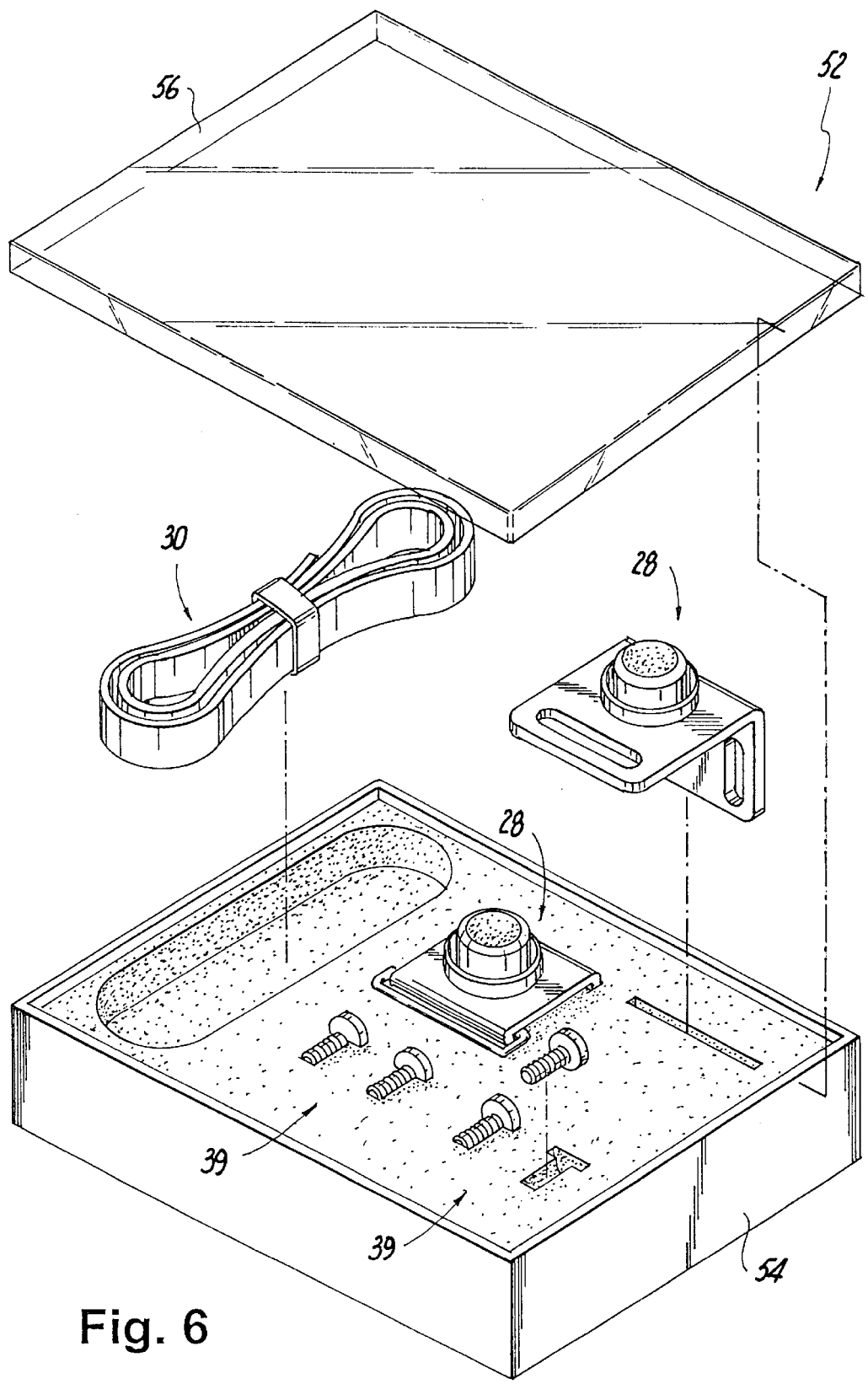
FIG. 6 is a perspective view of a kit for marketing an embodiment of the disclosed invention.

Referring to FIG. 6, an embodiment of the present invention is illustrated as part of a kit 52. The kit 52 is a convenient way in which embodiments of the present invention may be marketed. Included in the kit 52 are two mounting brackets 28, a composite strap 30, and four 12/32 threaded fasteners 39. The kit 52 may be packaged as follows. The contents of the kit 52 are positioned on a base board 54 and sealed in position with a clear plastic overlay 56 utilizing vacuum-packing methods that are well known in the art of packaging. Of course, those having ordinary skill in the art will recognize that other packaging systems may be used to package the contents of the kit including, for example, boxes with inserts, plastic bags, paper bags, etc.

The present disclosure includes descriptions of preferred embodiments that are intended to illustrate rather than define the present invention. Modifications, substitutions and rearrangements of the forgoing embodiments may be made without departing from the scope of the invention defined by the appended claims. It is noted that 35 U.S.C. §112, paragraph 6, is not meant to be invoked unless a claim appended hereto, or otherwise added, specifically includes "means for" terminology.

What is claimed is:

1. A mounting strap for securing equipment in a rack having side frames, comprising:
    two angled brackets, each angled bracket including a first leg having a slot for receiving a strap and a second leg having a means for fastening the angled bracket to one of the side frames of the rack;
    a first bumper mounted to one of the angled brackets on the outside surface of its first leg and a second bumper mounted to the other of the angled brackets on the outside surface of its first leg; and
    a composite strap having one end passing through the slot of one of the angled brackets and fastened to the one end, and the other end passing through the slot of the other of the angled brackets and fastened to the other end, the composite strap including an elastic strap section having a strap-type fastener section attached to each end, wherein at least one of the two strap-type fastener sections is detachable.

2. A mounting strap as recited in claim 1, wherein the first and second bumpers are adhesive-backed for adhering each of the first and second bumpers to its respective angled bracket.

3. A mounting strap as recited in claim 1, wherein the at least one detachable strap-type fastener section is a hook and loop type fastener.

4. A mounting strap as recited in claim 3, wherein the hook and loop type fastener is constructed using a fastening system selected from the group comprising a standard Velco® brand hook and loop type fastening system and an Omni-Tape® brand hook and loop type fastening system.

5. A mounting strap as recited in claim 1, wherein the slots are machined into the first leg of each of the angled brackets.

6. A mounting strap as recited in claim 1, wherein the first leg of each of the angled brackets includes a reverse bend to which a strap ring is mounted for defining the slot.

7. A mounting strap as recited in claim 1, wherein the elastic strap section is sewn to each of the strap-type fastener sections.

8. A mounting strap for securing equipment in a rack having side frames, comprising:
    two angled brackets, each angled bracket including a first leg that defines a slot for receiving a strap and a second leg having a fastener for securing the angled bracket to one of the side frames of the rack;
    two bumpers, one of the bumpers mounted adjacent the slot of one of the angled brackets and the other of the bumpers mounted adjacent the slot of the other of the angled brackets; and
    a composite strap having a loop on each end, one of the loops passing through the slot in one of the angled brackets and the other of the loops passing through the slot in the other of the angled brackets, the composite strap including an elastic strap section having a strap-type fastener section attached to each end in each with which the loops are formed, wherein at least one of the two strap type fastener sections is detachable for unfastening the loop formed therein.

9. A mounting strap as recited in claim 8, wherein the bumpers are adhesive-backed for adhering each bumper to its respective angled bracket.

10. A mounting strap as recited in claim 8, wherein the at least one detachable strap-type fastener section is a hook and loop type fastener.

11. A mounting strap as recited in claim 10, wherein the hook and loop type fastener is constructed using a fastening system selected from the group comprising a standard Velco® brand hook and loop type fastening system and an Omni-Tape® brand hook and loop type fastening system.

12. A mounting strap as recited in claim 8, wherein the second leg of each of the two angled brackets defines mounting holes and the fasteners are selected from the group comprising 10–32, 12 –24, M5 and M6 threaded fasteners.

13. A mounting strap as recited in claim 8, wherein the first leg of each of the angled brackets includes a reverse bend to which a strap ring is mounted for defining the slot in each angled bracket.

14. A mounting strap as recited in claim 8, wherein the elastic strap section is sewn to each of the strap-type fastener sections.

15. A kit for securing equipment in a rack having side frames, comprising:
    two angled brackets, each angled bracket including a first leg having a slot for receiving a strap and a second leg defining an aperture for fastening the angled bracket to one of the side frames of the rack, wherein a first bumper is mounted to the outside of the first leg of one of the angled brackets and a second bumper is mounted to the outside of the first leg of the other of the angled brackets;
    a composite strap having one end passing through the slot for fastening to one of the angled brackets and the other end passing through the slot for fastening to the other of the angled brackets, the composite strap including an elastic strap section having a strap-type fastener section attached to each end, wherein at least one of the two strap-type fastener sections is detachable; and
    packing for containing the two angled brackets and the composite strap.

16. A kit as recited in claim 15, wherein each of the first and second bumpers includes a threaded stud for screwing each of the first and second bumpers to its respective angled bracket.

17. A kit as recited in claim 15, wherein the at least one detachable strap-type fastener section is a hook and loop type fastener.

18. A kit as recited in claim 17, wherein the hook and loop type fastener is constructed using a fastening system selected from the group comprising a standard Velco® brand hook and loop type fastening system and an Omni-Tape® brand hook and loop type fastening system.

19. A kit as recited in claim 15, further including a captivated spring-loaded fastener pressed into the aperture of one of the angled brackets and a captivated spring-loaded fastener pressed into the aperture of the other of the angled brackets.

20. A kit as recited in claim 15, wherein the first leg of each of the angled brackets includes a reverse bend to which a strap ring is mounted for defining the slot in each angled bracket.

21. A kit as recited in claim 15, wherein the elastic strap section is sewn to each of the strap-type fastener sections.

22. A mounting strap for securing equipment in a rack having side frames, comprising:
- a composite strap having a first end, a second end, a first fastener section adjacent said first end, a second fastener section adjacent said second end, and an elastic strap section positioned between said first and second fastener sections;
- a first angled bracket having first and second legs, the first leg of the first angled bracket having a first slot dimensioned for passage of the first end of the composite strap, and the second leg having means for fastening the first angled bracket to one of the side frames of the rack;
- a second angled bracket having first and second legs, the first leg of the second angled bracket having a second slot dimensioned for passage of the second end of the composite strap, and the second leg having means for fastening the second angled bracket to one of the side frames of the rack;
- wherein the composite strap is joined to the first angled bracket by looping the first end of the composite strap through the first slot of the first angled bracket and fastening the first end relative to the first fastener section of the composite strap, and
- wherein the composite strap is joined to the second angled bracket by looping the second end of the composite strap through the second slot of the second angled bracket and fastening the second end relative to the second fastener section of the composite strap, and
- wherein at least one of the first and second ends of the composite strap is detachably fastened relative to the composite strap; and
- wherein the composite strap does not contact the second legs of the first and second angled brackets when the composite strap is joined to the first and second angular brackets.

23. A mounting strap as recited in claim 22, further including a first bumper mounted to one of the first and second angled brackets on the outside surface of its first leg and a second bumper mounted to the other of the angled brackets on the outside surface of its first leg.

24. A mounting strap as recited in claim 23, wherein the first and second bumpers are adhesive-backed for adhering each of the first and second bumpers to its respective angled bracket.

25. A mounting strap as recited in claim 22, wherein at least one of the first and second fastener sections is a hook and loop type fastener.

26. A mounting strap as recited in claim 25, wherein the hook and loop type fastener is constructed using a fastening system selected from the group comprising a standard Velcro® brand hook and loop type fastening system and an Omni-Tape® brand hook and loop type fastening system.

27. A mounting strap as recited in claim 22, wherein the slots are machined into the first leg of each of the angled brackets.

28. A mounting strap as recited in claim 22, wherein the first leg of each of the angled brackets includes a reverse bend to which a strap ring is mounted for defining the slot.

29. A mounting strap as recited in claim 22, wherein the elastic strap section is sewn to each of the first and second fastener sections.

30. A mounting strap as recited in claim 22, wherein the elastic strap section is sewn to each of the fastener sections.

31. A mounting strap for securing equipment in a rack having side frames, comprising:
- two angled brackets, each angled bracket including a first leg having a slot for receiving a strap and a second leg having a means for fastening the angled bracket to one of the side frames of the rack;
- wherein the first leg of each of the angled brackets includes a reverse bend to which a strap ring is mounted for defining the slot; and
- a composite strap having one end passing through the slot of one of the angled brackets and fastened to the one end, and the other end passing through the slot of the other of the angled brackets and fastened to the other end, the composite strap including an elastic strap section having a strap-type fastener section attached to each end, wherein at least one of the two strap-type fastener sections is detachable.

32. A mounting strap as recited in claim 31, further including a first bumper mounted to one of the angled brackets on the outside surface of its first leg and a second bumper mounted to the other of the angled brackets on the outside surface of its first leg.

33. A mounting strap as recited in claim 32, wherein the first and second bumpers are adhesive-backed for adhering each of the first and second bumpers to its respective angled bracket.

34. A mounting strap as recited in claim 31, wherein at least one of the fastener sections is a hook and loop type fastener.

35. A mounting strap as recited in claim 34, wherein the hook and loop type fastener is constructed using a fastening system selected from the group comprising a standard Velcro® brand hook and loop type fastening system and an Omni-Tape® brand hook and loop type fastening system.

36. A mounting strap as recited in claim 31, wherein the slots are machined into the first leg of each of the angled brackets.

* * * * *